(12) United States Patent
Cao

(10) Patent No.: US 10,964,911 B2
(45) Date of Patent: Mar. 30, 2021

(54) THIN FILM ENCAPSULATION STRUCTURE OF AMOLED AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Xuwen Cao, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 285 days.

(21) Appl. No.: 16/300,679

(22) PCT Filed: Aug. 23, 2018

(86) PCT No.: PCT/CN2018/101838
§ 371 (c)(1),
(2) Date: Nov. 12, 2018

(87) PCT Pub. No.: WO2019/227700
PCT Pub. Date: Dec. 5, 2019

(65) Prior Publication Data
US 2020/0395572 A1 Dec. 17, 2020

(30) Foreign Application Priority Data
May 31, 2018 (CN) .......................... 201810549801.1

(51) Int. Cl.
*H01L 51/52* (2006.01)
*G06F 3/041* (2006.01)
(Continued)

(52) U.S. Cl.
CPC ........ *H01L 51/5253* (2013.01); *G06F 3/0412* (2013.01); *H01L 27/323* (2013.01);
(Continued)

(58) Field of Classification Search
CPC ... H01L 51/5253; H01L 27/323; H01L 51/56; H01L 2227/323; H01L 37/3244; G06F 3/0412
See application file for complete search history.

(56) References Cited

U.S. PATENT DOCUMENTS 9,530,829 B2 * 12/2016 Yamazaki ........... H01L 27/3248
2016/0028034 A1 * 1/2016 Yasumoto ............. H01L 51/003
257/99
(Continued)

*Primary Examiner* — Vinh T Lam

(57) ABSTRACT

A thin-film encapsulation structure of an active-matrix organic light-emitting, diode (AMOLED) is provided, and a touch electrode layer is disposed thereon. The thin-film encapsulation structure includes a first ceramic layer, an organic layer, and a second ceramic layer. The second ceramic layer has a first film layer and a second film layer; a side end of the second film layer is contracted inward so that a recessed first step portion is defined at the side end of the second film layer and a side end of the first film layer. The second ceramic layer is changed into a design of a multi-layer stacked structure, and a recessed step portion is formed at the side ends of the upper and lower layers. Therefore, the traces can be placed in a larger space and resistant to line breakage, thereby ensuring the yield and product performance.

12 Claims, 2 Drawing Sheets

(51) Int. Cl.
*H01L 27/32* (2006.01)
*H01L 51/56* (2006.01)

(52) U.S. Cl.
CPC .......... *H01L 27/3244* (2013.01); *H01L 51/56* (2013.01); *H01L 2227/323* (2013.01)

(56) References Cited

U.S. PATENT DOCUMENTS

| | | | |
|---|---|---|---|
| 2016/0268349 A1* | 9/2016 | Zhao | H01L 51/5246 |
| 2016/0268551 A1* | 9/2016 | Shen | H01L 27/3244 |
| 2017/0010734 A1* | 1/2017 | Liu | H01L 27/323 |
| 2017/0147112 A1* | 5/2017 | Wang | G06F 3/044 |
| 2018/0024680 A1* | 1/2018 | Sakuishi | H01L 51/0097 345/174 |
| 2020/0295298 A1* | 9/2020 | Okada | H01L 51/50 |

* cited by examiner

THIN FILM ENCAPSULATION STRUCTURE OF AMOLED AND MANUFACTURING METHOD THEREOF

FIELD OF INVENTION

The present invention relates to a field of an active-matrix organic light-emitting diode (AMOLED) technology, and in particular, relates to an AMOLED thin film encapsulation structure and a manufacturing method thereof.

BACKGROUND OF INVENTION

It is known that with the continuous advancement of science and technology, image display technologies have also made a great progress. From the original cathode ray tube (CRT) monitors, display technologies begin to develop rapidly, not only in the size and weight of the display itself, and there is a big difference in the display principle.

In the current situation, liquid crystal displays (LCDs) have been replaced CRT displays to be mainstream applications in the industry. However, although LCD displays have the advantages of light weight and better display effect, they still have some disadvantages, for example, there is still further improvements in viewing angles, refresh rates, volume, and power consumption.

In this regard, the industry has further developed organic light-emitting diodes (OLEDs), and has developed active-matrix organic light-emitting diodes (AMOLEDs) based on OLEDs as a next-generation display technology.

In that, AMOLED has many advantages such as self-luminescence, low driving voltages, high luminous efficiency, short response time, high resolution and contrast ratio, near 180° viewing angle, and wide operating temperature range, and can achieve flexible display and large-area full-color display. AMOLED is the industry recognized as the most promising display device. At present, AMOLED technologies are developing toward flexible, thin-film encapsulation and integrated touch functions.

In an example of a thin film encapsulation, referring to FIG. 2, a common AMOLED thin film encapsulation structure in the industry usually has three-layer structure: a ceramic layer 410, an organic layer 420, and a ceramic layer 430. A thickness of the first ceramic layer 410 ranges from 10 to 100 nm, and a thickness of the second ceramic layer 430 ranges from 500 to 2000 nm, so as to achieve waterproof and oxygen-proof effect required for the encapsulation.

Since a screen integrated the touch function further forms touch layer structures 510, 520, and 530 on a thin film encapsulation structure, a touch electrode layer 510 is connected to an integrated circuit bonding area through a boundary of the second ceramic layer 430. As shown in FIG. 3, if the second ceramic layer 430 is too thick, cross-line problem thereof may easily cause the breakage of the touch layer structures 510, thereby reducing the yield and affecting the product performance.

Therefore, there is indeed a necessary to develop a new type of thin film encapsulation structure of an AMOLED to overcome the disadvantages in the prior art.

SUMMARY OF INVENTION

An aspect of the present invention is to provide an active-matrix organic light-emitting diode (AMOLED) thin-film encapsulation structure capable of effectively solving the cross-line problem of the touch electrode layer existing in the existing thin-film encapsulation structure, thereby improving the performance of the integrated touch screen and further improving the product performance.

The technical solutions adopted by the present invention are as follows:

A thin-film encapsulation structure of an active-matrix organic light-emitting diode (AMOLED) is provided for disposing a touch electrode layer thereon, and comprises: a first ceramic layer, an organic layer, and a second ceramic layer, wherein the second ceramic layer has a first film layer and a second film layer; wherein the second film layer is disposed on the first film layer, and a side end of the second film layer is contracted inward so that a recessed first step portion is defined at the side end of the second film layer and a side end of the first film layer.

The present invention changes a design that the existing second ceramic layer is a thick monolayer structure to a design that is two thin film layers structure, and provides a recessed step portion at a side end of the two thin film layers, so as to effectively reduce an influence of a side end portion of the second ceramic layer for traces of the touch electrode layer, so that the traces can be placed in a larger space and resistant to line breakage, thereby ensuring the yield and product performance.

Furthermore, the second ceramic layer is not limited to adopt two layers structure, and in a different embodiment, it may adopt a multi film layers structure. For example, it may specifically be a three film layers structure, a four film layers structure, a five film layers structure, a six film layers structure, and the like. The details may be determined as needed, and are not limited.

Additionally, in a different embodiment, in the multi film layers structure which the second ceramic layer is adopted, and the film layers preferably have a same thickness.

Moreover, in a different embodiment, in the multi film layers structure which the second ceramic layer uses, a step portion is defined at a side end of the upper and lower film layers of these film layers; and from an upper step to a lower step, the lower step is expand outward the upper step by 30 µm to 80 µm per level.

Furthermore, in a different embodiment, a thickness of the first film layer is equal to a thickness of the second film layer.

Additionally, in a different embodiment, a third film layer is further disposed on the second film layer, and a recessed second step portion is defined at a side end of the third film layer and the side end of the second film layer.

Moreover, in a different embodiment, the first step portion is extended outward the second step portion by 30 µm to 80 µm. The specific values can be 30 µm, 40 µm, 50 µm, 60 µm, 70 µm, and 80 µm, which are determined as needed and are not limited.

Furthermore, in various embodiments, a fourth film layer is further disposed on the third film layer, and a recessed third step portion is defined at a side end of the fourth film layer and the side end of the third film layer.

Additionally, in a different embodiment, the second step portion is extended outward the third step portion by 30 am to 80 mm. The specific values can be 30 µm, 40 µm, 50 µm, 60 µm, 70 µm, and 80 µm, which are determined as needed and are not limited.

Moreover, in a different embodiment, a fifth film layer is further disposed on the fourth film layer, and a recessed fourth step portion is defined at a side end of the fifth film layer and the side end of the fourth film layer.

Furthermore, in a different embodiment, the third step portion is extended outward the fourth step portion by 30 µm to 80 µm. The specific values can be 30 µm, 40 µm, 50 µm, 60 µm, 70 µm, and 80 µm, which are determined as needed and are not limited.

Additionally, in a different embodiment, the first film layer, the second film layer, the third film layer, the fourth film layer and the fifth film layer have a same thickness.

Moreover, in a different embodiment, the thickness of the first film layer is less than a thickness of the touch electrode layer by 200 nm to 400 nm. Specific values can be 400 nm, 350 nm, 300 nm, 250 nm, and 200 nm, which are determined as needed and are not limited.

Furthermore, in a different embodiment, the thickness of the second film layer is less than a thickness of the touch electrode layer by 200 nm to 400 nm. Specific values can be 400 nm, 350 nm, 300 nm, 250 nm, and 200 nm, which are determined as needed and are not limited.

Moreover, another aspect of the present invention provides a method for manufacturing a thin-film encapsulation structure of an active-matrix organic light-emitting diode (AMOLED), comprising: designing a mask of chemical vapor deposition (CVD) for the second ceramic layer of the thin-film encapsulation structure, wherein the mask uses a structure having at least two layers, and a recessed step portion is formed at an end side of an upper layer of the two layers.

Additionally, in a different embodiment, the thin film manufacturing apparatus used in the manufacturing method includes at least two chambers of processing chambers, and each of the processing chambers deposits a thin film.

Furthermore, in a different embodiment, the mask preferably adopts a five layers structure, each of the layers has a thickness about 200 nm to 300 nm, the steps portion are defined at the side ends of these thin film layers, and each layer of the steps portion from top to bottom expands by 30 µm to 80 µm. The expansion is 30 µm to 80 µm. The thin film manufacturing apparatus preferably includes five processing chambers.

Compared with the prior art, the beneficial effects of the present invention are: the present invention relates to an AMOLED thin-film encapsulation structure, that a existing design of a thick single layer structure of the second ceramic layer is changed into a design of a multi-layer stacked structure, and a recessed step portion is formed at the side ends of the upper and lower layers, such that the step portions at the side ends of the entire second ceramic layer becomes an inclined slope. Therefore, a problem of a side end portion of the second ceramic layer for traces of the touch electrode layer can be effectively solved, thereby improves the integrated touch screen performance, and correspondingly improves the product performance.

Furthermore, since the thin film encapsulation structure according to the present invention is designed to use a multiple thin film layers stacking structure, such that the overall compactness of the thin film layers can be effectively increased, so that pinhole defects existing in a single thick film depositing process during the manufacturing process can be reduced, improve the reliability of the encapsulation structure.

Figure 1:
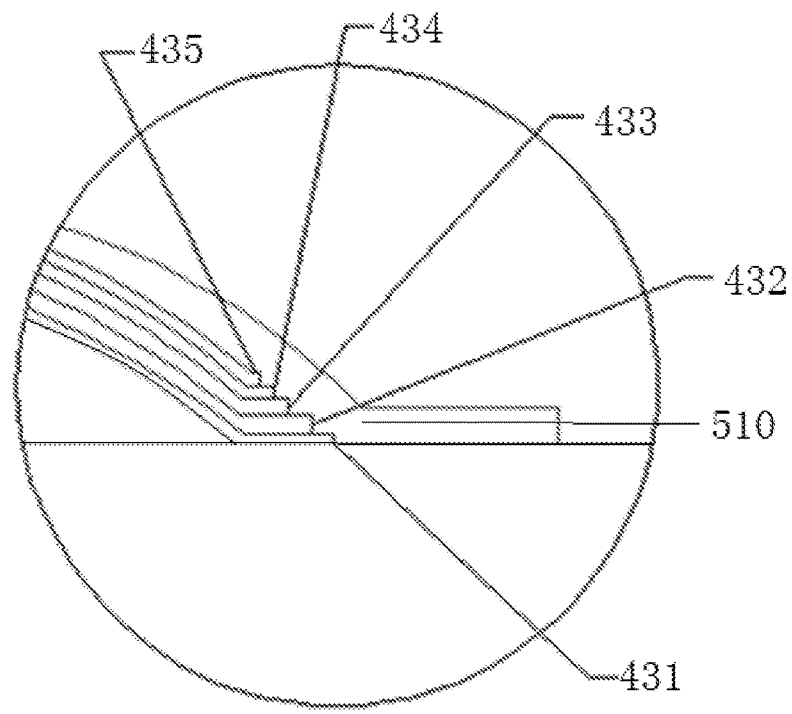
FIG. 1 is a schematic partial structural view of a thin film encapsulation structure of an AMOLED according to an embodiment of the present invention.
Figure 2:
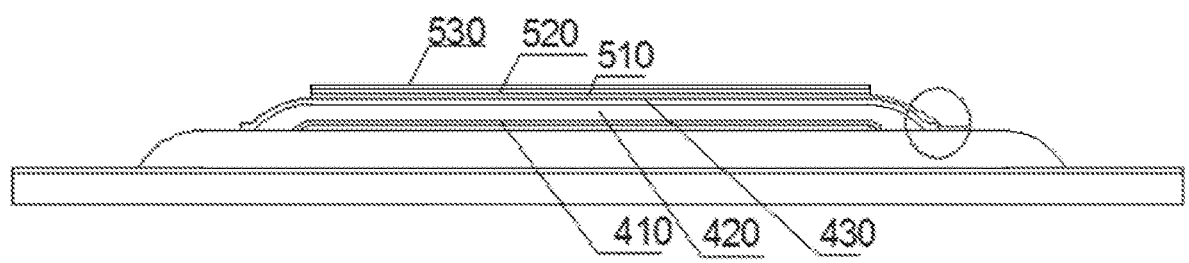
FIG. 2 is a schematic structural view of a thin film encapsulation structure of an AMOLED according to the prior art.
Figure 3:
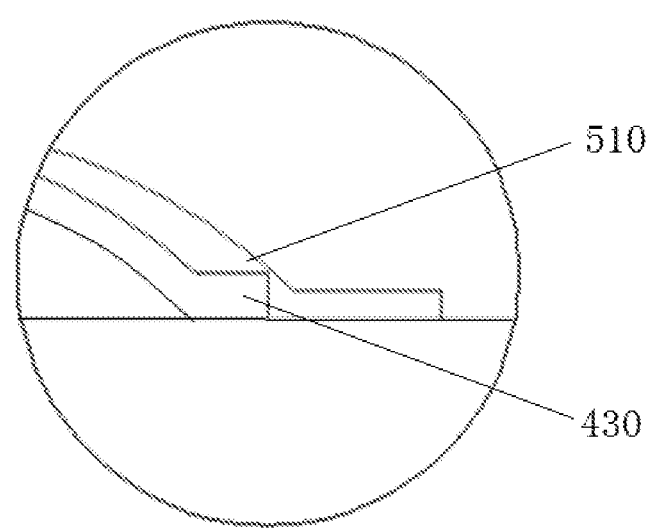
FIG. 3 is an enlarged view of a circled portion in FIG. 2.

The reference numerals in FIGS. 1 to 3 are described as follows:

| | |
|---|---|
| First film layer 431 | Second film layer 432 |
| Third film layer 433 | Fourth film layer 434 |
| Fifth layer 435 | First ceramic layer 410 |
| Organic layer 420 | Second ceramic layer 430 |
| touch electrode layer 510 | Touch layer structure 520, 530 |

DETAILED DESCRIPTION OF PREFERRED EMBODIMENTS

The following further describes in detail the technical solutions of an AMOLED encapsulation structure and a manufacturing method according to the present invention with reference to the accompanying drawings and embodiments.

One embodiment of the present invention provides an encapsulation structure of an AMOLED for providing a touch electrode layer, including a first ceramic layer, an organic layer, and a second ceramic layer.

Please referring to FIG. 1, the second ceramic layer includes a first film layer 431, a second film layer 432, a third film layer 433, a fourth film layer 434, and a fifth film layer 435 sequentially stacked from bottom to top. A touch electrode layer 510 is disposed on the fifth film layer 435.

The first film layer 431, the second film layer 432, the third film layer 433, the fourth film layer 434, and the fifth film layer 435 preferably have a same thickness and are smaller than a thickness of the touch electrode layer 510 by 300 nm. The above values of the thickness of the film layers are exemplified, and the specific values may also be 400 nm, 350 nm, 300 nm, 250 nm, and 200 nm, which are determined specifically as needed and are not limited.

Furthermore, at the side ends of the first film layer 431, the second film layer 432, the third film layer 433, the fourth film layer 434, and the fifth film layer 435, are sequentially defined a first step portion, a second step portion, a third step portion, and a fourth step portion from bottom to top. These step portions, from top to bottom, each layer of step expands by 50 µm. That is, a depth of the first step portion at the lowest level is largest, and a depth of the fourth step portion at the uppermost level is the smallest. The above-mentioned expansion value of the step is an illustrative example, and the specific values may be 30 µm, 40 µm, 50 µm, 60 µm, 70 µm, and 80 µm, which are determined specifically as needed and are not limited.

The present invention relates to an AMOLED thin-film encapsulation structure, that an existing design of a thick single layer structure of the second ceramic layer is changed into a design of a multi-layer stacked structure, and a recessed step portion is formed at the side ends of the upper and lower layers, such that the step portions at the side ends of the entire second ceramic layer becomes an inclined slope. Therefore, a problem of a side end portion of the second ceramic layer for traces of the touch electrode layer can be effectively solved, thereby improves the integrated touch screen performance, and correspondingly improves the product performance.

Furthermore, since the thin film encapsulation structure according to the present invention is designed to use a multiple thin film layers stacking structure, such that the overall compactness of the thin film layers can be effectively increased, so that pinhole defects existing in a single thick film depositing process during the manufacturing process can be reduced, improve the reliability of the encapsulation structure.

Furthermore, another embodiment of the present invention provides a manufacturing method of the encapsulation structure of an AMOLED, which a thickness of the second ceramic layer is 1000 nm.

When designing a mask of chemical vapor deposition (CVD) for the second ceramic layer of the thin-film encapsulation structure, the mask uses a structure having five layers, a thickness of each layer is 200 nm, and a recessed step portion is defined at an end side of each layer. A step of each layer down sequentially expands outward by 50 µm. The thin film manufacturing has processing chambers including five processing chambers, each of the processing chambers deposits a thin film.

The technical scope of the present invention is not limited to the contents in the above description, and those skilled in the art may make various variations and modifications to the above embodiments without departing from the technical idea of the present invention, and these variations and modifications shall belong within the scope of the present invention.

What is claimed is:

1. A thin-film encapsulation structure of an active-matrix organic light-emitting diode (AMOLED), for disposing a touch electrode layer thereon, comprising:
    a first ceramic layer, an organic layer, and a second ceramic layer, wherein the second ceramic layer has a first film layer and a second film layer;
    wherein the second film layer is disposed on the first film layer, and a side end of the second film layer is contracted inward so that a recessed first step portion is defined at the side end of the second film layer and a side end of the first film layer,
    wherein a third film layer is further disposed on the second film layer, and a recessed second step portion is defined at a side end of the third film layer and the side end of the second film layer
    wherein the first step portion is extended outward the recessed second step portion by 30 µm to 80 µm.

2. The thin-film encapsulation structure of the AMOLED according to claim 1, wherein a thickness of the first film layer is equal to a thickness of the second film layer.

3. The thin-film encapsulation structure of the AMOLED according to claim 1, wherein a fourth film layer is further disposed on the third film layer, and a recessed third step portion is defined at a side end of the fourth film layer and the side end of the third film layer.

4. The thin-film encapsulation structure of the AMOLED according to claim 3, wherein the recessed second step portion is extended outward the recessed third step portion by 30 µm to 80 µm.

5. The thin-film encapsulation structure of the AMOLED according to claim 3, wherein a fifth film layer is further disposed on the fourth film layer, and a recessed fourth step portion is defined at a side end of the fifth film layer and the side end of the fourth film layer.

6. The thin-film encapsulation structure of the AMOLED according to claim 5, wherein the recessed third step portion is extended outward the fourth step portion by 30 µm to 80 µm.

7. The thin-film encapsulation structure of the AMOLED according to claim 5, wherein the first film layer, the second film layer, the third film layer, the fourth film layer and the fifth film layer have a same thickness; and wherein the thickness of the first film layer is less than a thickness of the touch electrode layer by 200 nm to 400 nm.

8. A thin-film encapsulation structure of an active-matrix organic light-emitting diode (AMOLED), for disposing a touch electrode layer thereon, comprising:
    a first ceramic layer, an organic layer, and a second ceramic layer, wherein the second ceramic layer has a first film layer and a second film layer;
    wherein the second film layer is disposed on the first film layer, and a side end of the second film layer is contracted inward so that a recessed first step portion is defined at the side end of the second film layer and a side end of the first film layer,
    wherein a third film layer is further disposed on the second film layer, and a recessed second step portion is defined at a side end of the third film layer and the side end of the second film layer,
    wherein a fourth film layer is further disposed on the third film layer, and a recessed third step portion is defined at a side end of the fourth film layer and the side end of the third film layer, and
    wherein the recessed third step portion is extended outward the fourth step portion by 30 µm to 80 µm.

9. The thin-film encapsulation structure of the AMOLED according to claim 8, wherein a thickness of the first film layer is equal to a thickness of the second film layer.

10. The thin-film encapsulation structure of the AMOLED according to claim 8, wherein a fifth film layer is further disposed on the fourth film layer, and a recessed fourth step portion is defined at a side end of the fifth film layer and the side end of the fourth film layer.

11. The thin-film encapsulation structure of the AMOLED according to claim 10, wherein the recessed third step portion is extended outward the fourth step portion by 30 µm to 80 µm.

12. The thin-film encapsulation structure of the AMOLED according to claim 10, wherein the first film layer, the second film layer, the third film layer, the fourth film layer and the fifth film layer have a same thickness; and wherein the thickness of the first film layer is less than a thickness of the touch electrode layer by 200 nm to 400 nm.

* * * * *